United States Patent
Kerszykowski et al.

(10) Patent No.: US 6,221,538 B1
(45) Date of Patent: *Apr. 24, 2001

(54) METHOD FOR AUTOMATING MANUFACTURE OF PHOTOMASK

(75) Inventors: David Kerszykowski, Chandler; Robert Dwayne Colclasure, Jr.; John Michael Garbayo, both of Mesa; Raymond Leo Miller, Jr., Gilbert, all of AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/033,049

(22) Filed: Mar. 2, 1998

(51) Int. Cl.[7] ........................................ G03F 9/00
(52) U.S. Cl. .................. 430/5; 430/30; 430/311
(58) Field of Search ................... 430/5, 30, 311

(56) References Cited

U.S. PATENT DOCUMENTS

| | | | |
|---|---|---|---|
| 5,792,581 | * | 8/1998 | Ohnuma ................................. 430/30 |
| 5,858,591 | * | 1/1999 | Lin et al. .............................. 430/30 |
| 5,863,680 | * | 1/1999 | Kawakubo et al. .................... 430/30 |

* cited by examiner

*Primary Examiner*—Christopher G. Young
(74) *Attorney, Agent, or Firm*—Anthony M. Martinez

(57) ABSTRACT

A computer system (10) and method for automating manufacture of a photomask. The computer system (10) has a product database (21) that stores information used to manufacture the photomask. In addition, a semiconductor device is manufactured using the information stored in the product database (21). The information is transmitted to the product database (21) from semiconductor satellite systems such as a fabrication facility (14), a first mask shop (12), and a second mask shop (13). The computer system (10) chooses a mask shop for producing the photomask by using the information transmitted form the first mask shop (12) and the second mask shop (13).

13 Claims, 2 Drawing Sheets

METHOD FOR AUTOMATING MANUFACTURE OF PHOTOMASK

BACKGROUND OF THE INVENTION

The present invention relates, in general, to semiconductor manufacturing and, more particularly, to automating semiconductor manufacturing.

Presently, information for manufacturing a semiconductor device is manually generated and shared by semiconductor groups or individuals that are involved with the manufacture of a semiconductor device. For example, a design group is responsible for the design of the semiconductor device and a production group is responsible for the manufacturing of the semiconductor device. The production group uses information generated by the design group for manufacturing a semiconductor device. This information, some of it in hard copy form, is delivered and shared between various groups involved in manufacturing semiconductor devices. The various groups receive and process this information at different times. A problem with this method is that there is no structure of the information or coordination in sharing of the information. Without structure or coordination of the semiconductor information, the process for manufacturing the semiconductor device can be complex, inefficient, and costly.

Accordingly, it would be advantageous to have a method for automating the manufacture of a semiconductor device. It would be of further advantage for the method to structure information used to manufacture the semiconductor device.

DETAILED DESCRIPTION OF THE DRAWINGS

Generally, the present invention provides a method for manufacturing a semiconductor device. More particularly, the present invention generates a database that contains information for manufacturing a semiconductor device. A database is a collection of information or data that is organized in a structured format. The data stored in the database is typically retrievable through a computer system. The present invention provides a database generated by transmitting semiconductor data to the database from semiconductor satellite systems such as, for example, product groups, mask shops, fabrication facilities, etc. Data transmitted to the database is stored in the database by the computer system in a structured format that facilitates sorting and retrieving the data. Techniques for storing data in a database in a structured format are well known to those skilled in the art. In addition, the present invention provides a method for manufacturing a photomask in accordance with the information stored in the database.

Figure 1:
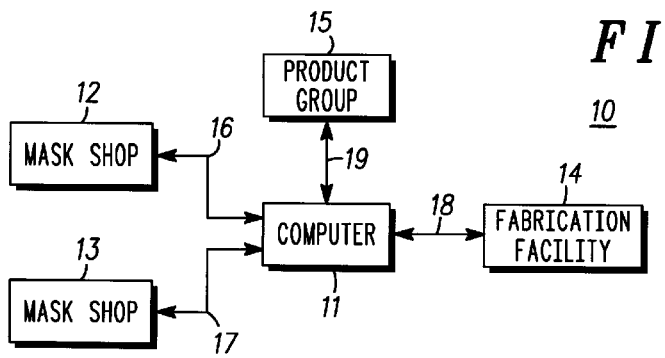
FIG. 1 is a block diagram of a computer system used for manufacturing a semiconductor device in accordance with an embodiment of the present invention.

FIG. 1 is a block diagram of a computer system 10 used for manufacturing a semiconductor device in accordance with the present invention. Computer system 10 receives data from and transmits data to one or more semiconductor satellite systems. More particularly, computer system 10 has a computer 11 that receives data from and transmits data to a mask shop 12, a mask shop 13, a fabrication facility 14, and a product group 15. The bi-directional transfer of data to and from computer 11 is identified in FIG. 1 by data lines 16, 17, 18, and 19. Computer 11 is connected to mask shop 12, mask shop 13, fabrication facility 14, and product group 15 via data lines 16, 17, 18, and 19, respectively. Product group 15 provides information for manufacturing the semiconductor device. Fabrication facility 14 uses data transmitted from computer 11 in its semiconductor processes for manufacturing the semiconductor device. Mask shops 12 and 13 manufacture photomasks (not shown) such as, for example, reticles, plates, or the like. As those skilled in the art are aware, photomasks are used by fabrication facilities in the photolithographic steps of semiconductor manufacture.

Figure 2:
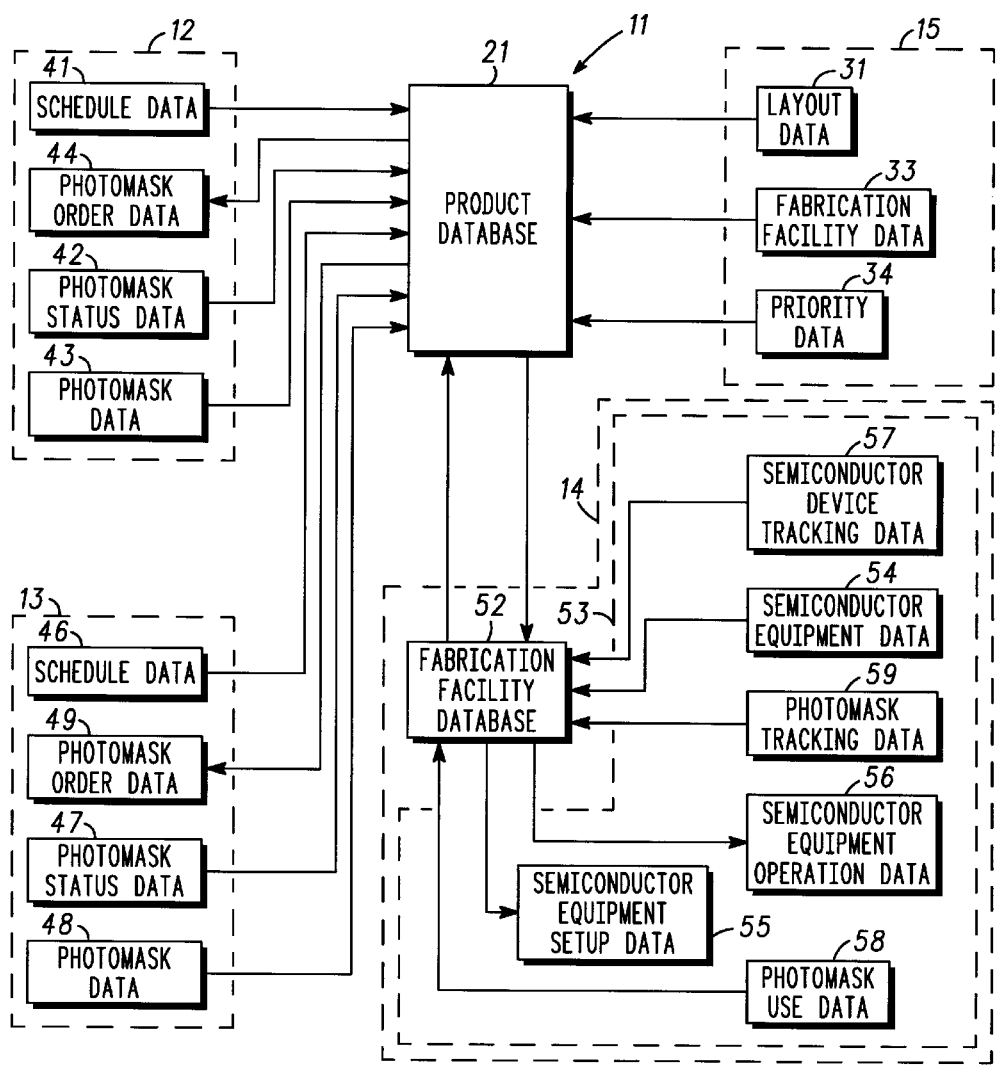
FIG. 2 illustrates the transfer of data in the computer system of FIG. 1.

FIG. 2 illustrates the transfer of data in computer system 10 of FIG. 1. It should be understood that the same reference numerals are used in the figures to denote the same elements. In accordance with the present invention, computer 11, product group 15, fabrication facility 14, and mask shops 12 and 13 cooperate to manufacture a semiconductor device by transferring data to and from computer 11. More particularly, computer 11 has a product database 21 for receiving and storing the data from fabrication facility 14, product group 15, and mask shops 12 and 13. In addition, data is generated by computer 11 from the data stored in product database 21.

Product group 15 provides layout data 31, fabrication facility data 33, and priority data 34. In addition, product group 15 transmits layout data 31, fabrication facility data 33, and priority data 34 to product database 21. Layout data 31 is data associated with the circuit layout of the semiconductor device. Fabrication facility data 33 is information about the semiconductor processes and equipment of fabrication facility 14 for manufacturing the semiconductor device. If more than one fabrication facility is available, then fabrication facility data 33 denotes which fabrication facility is chosen by product group 15 for manufacturing the semiconductor device. If more than one product is being produced by product group 15, then priority data 34 provides a priority value for each product to denote which product should be manufactured first. For example, if product group 15 produces two products, product "X" and product "Y", and it is determined by product group 15 that product "X" should be produced before product "Y", then the priority value of product "X" is greater than the priority value of product "Y".

Mask shop 12 provides schedule data 41, photomask status data 42, and photomask data 43. This data is transmitted from mask shop 12 to product database 21. In addition, mask shop 12 receives photomask order data 44 from product database 21. Photomask order data 44 is generated by computer 11 from data stored in product database 21 and provides mask shop 12 with information for producing a photomask. Schedule data 41 has information about the availability of mask shop 12. In other words, schedule data 41 provides the date when mask shop 12 can begin the production of a photomask. During the production of a photomask, mask shop 12 generates photomask status data 42 which has status information about the production of a photomask by mask shop 12. For example, photomask status data 42 includes information such as the date when a photomask being produced by mask shop 12 will be completed and delivered to fabrication facility 14. After a photomask is produced by mask shop 12, the photomask is delivered to fabrication facility 14 and used by fabrication facility 14 for manufacturing the semiconductor device. In addition, mask shop 12 generates and transmits photomask data 43 to product database 21. Photomask data 43 has information about the photomask produced by mask shop 12.

Similar to mask shop 12, mask shop 13 provides schedule data 46, photomask status data 47, photomask data 48. This data is transmitted from mask shop 13 to product database 21. In addition, mask shop 13 receives photomask order data 49 from product database 21. Photomask order data 49 is generated by computer 11 from data stored in product database 21 and provides mask shop 13 with information for producing a photomask. Schedule data 46 has information about the availability of mask shop 13. Photomask status data 47 and photomask data 48 have information about a photomask produced by mask shop 13.

Fabrication facility 14 has a fabrication facility database 52 for transferring data to and from product database 21. In addition, fabrication facility database 52 transfers semiconductor process data to and from a semiconductor process system 53 of fabrication facility 14. Semiconductor process system 53 represents the semiconductor processes and equipment used by fabrication facility 14 for manufacturing the semiconductor device. Examples of semiconductor process data used by semiconductor process system 53 include semiconductor equipment setup data 55 and semiconductor equipment operation data 56. Semiconductor equipment setup data 55 is information that is used to initialize the semiconductor equipment and semiconductor equipment operation data 56 is information that is used to operate the semiconductor equipment. Semiconductor process system 53 generates semiconductor process data such as, for example, semiconductor equipment data 54, semiconductor device tracking data 57, photomask use data 58, and photomask tracking data 59. This data is transmitted to fabrication facility database 52 from semiconductor process system 53. Semiconductor equipment data 54 contains information about the semiconductor equipment that is used by fabrication facility 14 for manufacturing the semiconductor device. Photomask tracking data 59 and photomask use data 58 provide status information on a photomask used by the semiconductor equipment of fabrication facility 14, e.g., the number of times a photomask has been used. Semiconductor device tracking data 57 provides status information on a semiconductor device being manufactured by fabrication facility 14. For example, semiconductor device tracking data 57 includes information such as the date when a semiconductor device being produced by fabrication facility 14 will be completed or the location of the semiconductor device within fabrication facility 14.

Although computer system 10 is illustrated as including two databases, this is not a limitation of the present invention. Computer system 10 can include one database by combining product database 21 and fabrication facility database 52 or it can include more databases.

Figure 3:
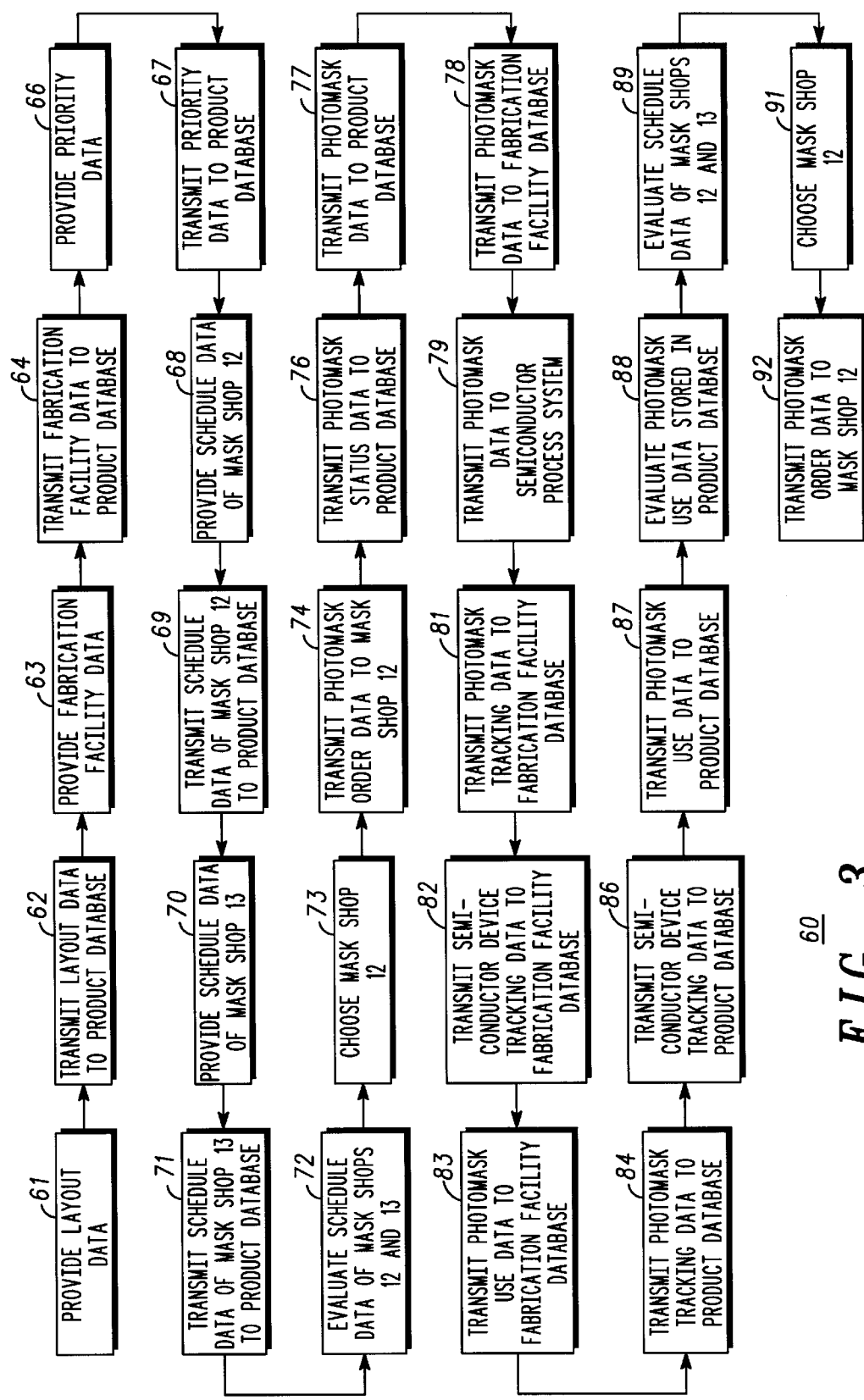
FIG. 3 is a flow diagram of a method for manufacturing a semiconductor device in accordance with the present invention using the data described in FIG. 2.

FIG. 3 is a flow diagram 60 of a method for manufacturing a semiconductor device in accordance with the present invention using the data described in FIG. 2. In a preferred embodiment, the method of the present invention is implemented using computer system 10 described in FIGS. 1 and 2.

The method for manufacturing a semiconductor device is described with reference to FIGS. 2 and 3. A beginning step 61 in manufacturing a semiconductor device is providing circuit layout data of the semiconductor device, i.e., layout data 31. After layout data 31 has been provided, a preferred next step 62 includes sending or transmitting layout data 31 to product database 21. A step 63 includes providing fabrication facility data 33 for the fabrication facility chosen to manufacture the semiconductor device. In the preferred embodiment, fabrication facility data 33 is provided from both product group 15 and fabrication facility database 52. Fabrication facility data 33 includes information about the semiconductor processes and equipment used by the chosen fabrication facility, i.e., fabrication facility 14. Preferably, step 63 is followed by a step 64 that includes transmitting fabrication facility data 33 to product database 21. A step 66 includes providing priority data 34 for the semiconductor device and is preferably followed by a step 67 that includes transmitting priority data 34 to product database 21.

A step 68 includes providing schedule data of mask shop 12, i.e., schedule data 41. Step 68 is preferably followed by a step 69 that includes transmitting schedule data 41 to product database 21. A step 70 includes providing schedule data of mask shop 13, i.e., schedule data 46 and is preferably followed by a step 71 that includes transmitting schedule data 46 to product database 21.

A step 72 includes evaluating the schedule data of mask shops 12 and 13 stored in product database 21, i.e., schedule data 41 and schedule data 46. Step 72 is preferably followed by a step 73 that includes choosing a mask shop for generating a photomask used for manufacturing the semiconductor device. In the preferred embodiment, steps 72 and 73 are implemented by computer 11 using product database 21 which contains information about the availability of mask shops 12 and 13. Using product database 21, computer 11 chooses a mask shop by comparing the schedule data of mask shops 12 and 13 and determining which mask shop of the two can complete the photomask by a preferred completion date for manufacturing the semiconductor device. The preferred completion date is determined by product group 15. By way of example, mask shop 12 is chosen to produce a photomask for manufacturing the semiconductor device.

A step 74 includes transmitting photomask order data 44 to mask shop 12 from product database 21. Photomask order data 44 is generated by information stored in product database 21. For example, photomask order data 44 is generated by combining layout data 31, fabrication facility data 33, and priority data 34. If mask shop 12 is manufacturing a photomask for another semiconductor device, then mask shop 12 compares the priority data of each semiconductor device and determines which semiconductor device has the greater priority value. A step 75 includes transmitting photomask status data 42 to product database 21 from mask shop 12 and is preferably performed during the manufacturing of the photomask by mask shop 12. After the photomask is manufactured by mask shop 12, a step 77 is preferably performed that includes transmitting photomask data 43 to product database 21. Step 61 through step 77 provide a method for automating manufacture of a photomask and generating the corresponding photomask data used for manufacturing the semiconductor device.

It should be noted that the order or sequence of steps 61, 62, 63, 64, 66, 67, 68, 69, 70, 71 is not a limitation of the present invention. Preferably, steps 61, 62, 63, 64, 66, and 67 occur before step 74 so that all the information is available in product database 21 for computer 11 to generate photomask order data 44 and transmit this data to mask shop 12. In addition, it is preferable that the sequence of steps 68, 69, 70, and 71 occur before step 72 so that the schedules of mask shops 12 and 13 are available in product database 21 for computer 11 to evaluate these schedules.

A step 78 includes transmitting photomask data 43 to fabrication facility database 52 from product database 21.

Preferably, a step 79 follows a step 78 and includes transmitting photomask data 43 to semiconductor process system 53 from fabrication facility database 52. Semiconductor process system 53 uses photomask data 43 to manufacture the semiconductor device. Examples of photomask data sent by mask shop 12 and used in semiconductor process system 53 include clear to chrome ratio data and alignment key offset data. Clear to chrome ratio data is information about the amount of clear area versus the amount of chrome area of a photomask. This data is used for varying the illumination of photolithography semiconductor equipment used in semiconductor process system 53. Alignment key offset data is information about how much the chrome pattern on the photomask is offset from a reference point. Using alignment key offset data of a photomask in semiconductor process system 53 improves yields of semiconductor devices manufactured using the photomask. Alignment key offset data is also referred to as inherent reticle error correction data.

After the manufacture of the semiconductor device is initiated using the photomask manufactured by mask shop 12, steps 81, 82, and 83 are performed. Step 81 includes transmitting photomask tracking data 59 to fabrication facility database 52 from semiconductor process system 53; step 82 includes transmitting semiconductor device tracking data 57 to fabrication facility database 52 from semiconductor process system 53, and step 83 includes transmitting photomask use data 58 to fabrication facility database 52 from semiconductor process system 53. In addition, it is preferable that steps 81, 82, and 83 are followed by steps 84, 86, and 87, respectively. Step 84 includes transmitting photomask tracking data 59 to product database 21 from fabrication facility database 52; step 86 includes transmitting semiconductor device tracking data 57 to product database 21 from semiconductor process system 53; and step 87 includes transmitting photomask use data 58 to product database 21 from fabrication facility database 52.

A step 88 is preferably implemented by computer 11 and includes evaluating the number of times the photomask manufactured by mask shop 12 is used in semiconductor process system 53. In other words, in step 88, computer 11 evaluates photomask use data 58 stored in product database 21. Repeated use of the photomask manufactured by mask shop 12 results in degradation of the photomask. Thus, computer 11 determines if a replacement photomask should be ordered by evaluating photomask use data 58.

If computer 11 determines that a replacement photomask should be ordered, then steps 89, 91, and 92 are executed. Steps 89, 91, and 92 are similar to steps 72, 73, and 74, respectively. Further, steps 89, 91, and 92 are the beginning steps of a method for manufacturing a replacement photomask used to manufacture the semiconductor device. Step 89 includes evaluating the schedule data of mask shops 12 and 13 stored in product database 21, i.e., schedule data 41 and schedule data 46. Step 89 is preferably followed by a step 91 that includes choosing a mask shop for generating the replacement photomask used for manufacturing the semiconductor device. Similar to steps 72 and 73, steps 89 and 91 are implemented by computer 11 using product database 21 which contains information about the availability of mask shops 12 and 13. Mask shop 12 is chosen to produce the replacement photomask for manufacturing the semiconductor device. Step 92 includes transmitting photomask order data 49 to mask shop 12 from product database 21. Photomask order data 49 contains information stored in product database 21 for producing the replacement photomask. For example, photomask order data 49 is similar to photomask order data 44 used to produce the photomask manufactured by mask shop 12. Photomask order data 49 includes layout data 31, fabrication facility data 33, and priority data 34. Steps 83, 87, 88, 89, 91, and 92 provide a method for automating the ordering of a replacement photomask used for manufacturing a semiconductor device; these steps are optional.

By now it should be appreciated that a method for automating manufacture of a photomask used for manufacturing a semiconductor device is provided. An advantage of the present invention is that it provides a computer system having a database for implementing steps for manufacturing a photomask and generating the corresponding photomask data. Another advantage of the present invention is that it provides a method for automating manufacture of a replacement photomask used for manufacturing a semiconductor device.

What is claimed is:

1. A method for automating manufacture of a photomask used for manufacturing a semiconductor device, comprising the steps of:

transmitting layout data of the semiconductor device to a database;

transmitting schedule data of a first mask shop to the database;

transmitting schedule data of a second mask shop to the database;

evaluating the schedule data of the first mask shop and the schedule data of the second mask shop to determine which mask shop is available to manufacture the photomask;

choosing the first mask shop to manufacture the photomask after evaluating the schedule data in the database;

manufacturing the photomask using information stored in the database; and manufacturing the semiconductor device using information stored in the database.

2. The method of claim 1, further including the steps of:

transmitting fabrication facility data to the database; and storing the layout data and the fabrication facility data in the database.

3. The method of claim 2, wherein the step of manufacturing a photomask using information stored in the database includes the steps of:

generating photomask order data by combining the fabrication facility data and the layout data;

using the photomask order data to produce the photomask.

4. The method of claim 1, wherein the step of manufacturing the semiconductor device using information stored in the database further includes the steps of:

transmitting photomask status data to the database from the first mask shop;

transmitting photomask data to the database from the first mask shop;

transmitting the photomask data from the database to a fabrication facility; and using the photomask data in a semiconductor process system of the fabrication facility to manufacture the semiconductor device.

5. The method of claim 4, wherein the step of transmitting the photomask data from the database to a fabrication facility further includes transmitting the photomask data from the database to a second database of the fabrication facility and further including the steps of, transmitting the photomask data from the second database to the semiconductor process system of the fabrication facility, transmitting semiconductor device tracking data from the semiconductor process system to the second database, transmitting photomask tracking data to the second database, and using the photomask data in the semiconductor process system to manufacture the semiconductor device.

6. The method of claim 4, further comprising the step of manufacturing a replacement photomask in accordance with information stored in the database.

7. The method of claim 6, wherein the step of manufacturing a replacement photomask in accordance with information stored in the database further includes the steps of:

transmitting photomask use data from the fabrication facility to the database;

evaluating the photomask use data;

choosing the first mask shop to produce the replacement photomask;

transmitting photomask order data to the first mask shop from the database; and using the photomask order data to manufacture the replacement photomask.

8. The method of claim 7, wherein the step of choosing the first mask shop to produce the replacement photomask further includes the steps of:

transmitting schedule data of the first mask shop to the database;

transmitting schedule data of a second mask shop to the database; and evaluating the schedule data of the first mask shop and the schedule data of the second mask shop.

9. A method for automating ordering of a replacement photomask, comprising the steps of:

storing layout data of a semiconductor device in a database;

transmitting photomask use data from a fabrication facility to the database;

choosing a mask shop using information stored in the database; and manufacturing the replacement photomask at the mask shop using information stored in the database; and manufacturing the semiconductor device using information stored in the database.

10. The method of claim 9, wherein the step of manufacturing the replacement photomask at the mask shop using information stored in the database further includes the steps of:

evaluating the photomask use data;

transmitting schedule data of the mask shop to the database from the mask shop;

transmitting schedule data of a second mask shop to the database from the second mask shop;

storing the schedule data of the mask shop in the database;

storing the schedule data of the second mask shop in the database;

evaluating the schedule data of the mask shop and the schedule data of the second mask shop to determine which mask shop is available to manufacture the replacement photomask and then choosing the mask shop to manufacture the replacement photomask;

transmitting photomask order data to the mask shop from the database; and using the photomask order data to manufacture the replacement photomask at the mask shop.

11. The method of claim 2, wherein the fabrication facility data includes information about semiconductor processes and equipment of a fabrication facility that is used to manufacture the semiconductor device.

12. The method of claim 4 wherein the photomask data includes clear to chrome ratio data and alignment key offset data of the photomask manufactured by the first mask shop.

13. The method of claim 7, wherein the photomask use data includes a value representative of number of times that the photomask is used by the fabrication facility.

* * * * *